United States Patent
Huang et al.

(10) Patent No.: US 10,475,793 B2
(45) Date of Patent: Nov. 12, 2019

(54) CAPACITOR CELL AND STRUCTURE THEREOF

(71) Applicant: Taiwan Semiconductor Manufacturing Co., Ltd., Hsinchu (TW)

(72) Inventors: Chien-Yao Huang, Taipei (CA); Wun-Jie Lin, Hsinchu (TW); Chia-Wei Hsu, New Taipei (TW); Yu-Ti Su, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/495,106

(22) Filed: Apr. 24, 2017

(65) Prior Publication Data
US 2018/0308846 A1 Oct. 25, 2018

(51) Int. Cl.
| | |
|---|---|
| *H01L 27/092* | (2006.01) |
| *H01L 29/06* | (2006.01) |
| *H01L 29/08* | (2006.01) |
| *H01L 29/94* | (2006.01) |
| *H01L 27/02* | (2006.01) |
| *H01L 27/08* | (2006.01) |
| *H01L 29/861* | (2006.01) |

(52) U.S. Cl.
CPC ...... *H01L 27/0928* (2013.01); *H01L 27/0262* (2013.01); *H01L 27/0266* (2013.01); *H01L 29/0649* (2013.01); *H01L 29/0847* (2013.01); *H01L 29/94* (2013.01); *H01L 27/0811* (2013.01); *H01L 29/861* (2013.01)

(58) Field of Classification Search
CPC ............ H01L 27/0928; H01L 27/0207; H01L 27/0251
USPC ............................. 365/72, 189.05; 327/536
See application file for complete search history.

(56) References Cited

U.S. PATENT DOCUMENTS

| | | | |
|---|---|---|---|
| 7,940,118 B1 * | 5/2011 | Forghani-zadeh | G05F 1/56 327/536 |
| 2009/0180237 A1 | 7/2009 | Hou et al. | |
| 2009/0254222 A1 * | 10/2009 | Berman | E06B 9/322 700/275 |
| 2012/0133315 A1 * | 5/2012 | Berman | E06B 9/322 318/480 |
| 2013/0057937 A1 * | 3/2013 | Berman | E06B 9/68 359/230 |
| 2013/0175589 A1 | 7/2013 | Chen | |
| 2014/0054788 A1 * | 2/2014 | Majima | B82Y 10/00 257/773 |
| 2015/0049229 A1 * | 2/2015 | Liu | H01L 27/14685 348/308 |

(Continued)

*Primary Examiner* — Bo Fan
(74) *Attorney, Agent, or Firm* — McClure, Qualey & Rodack, LLP

(57) ABSTRACT

A capacitor cell is provided. A first PMOS transistor is coupled between a power supply and a first node, having a gate coupled to a second node. A first NMOS transistor coupled between a ground and the second node, having a gate coupled to the first node. A second PMOS transistor, having a drain coupled to the second node, a gate coupled to the second node, and a source coupled to the power supply or the first node. A second NMOS transistor, having a drain coupled to the first node, a gate coupled to the first node, and a source coupled to the ground or the second node.

20 Claims, 16 Drawing Sheets

(56) References Cited

U.S. PATENT DOCUMENTS

2015/0262635 A1* 9/2015 Joo ................... G11C 7/1087
                                                    365/72
2016/0359407 A1* 12/2016 Yang ................ H03K 17/6872
2016/0365753 A1* 12/2016 Lee ..................... H02J 50/20
2017/0111035 A1* 4/2017 Lee ................... H03K 5/1534

* cited by examiner

CAPACITOR CELL AND STRUCTURE THEREOF

BACKGROUND

Power supply lines in an integrated circuit (IC) can supply current to charge and discharge active and passive devices in the IC. For example, digital complementary metal-oxide-semiconductor (CMOS) circuits draw current when the clock makes a transition. During operation of circuits, the power supply lines supply transient currents with a relatively high intensity, which can result in voltage noise in the power supply lines. The voltage in the power supply line will fluctuate when the fluctuation time of the transient current is short or when its parasitic inductance or parasitic resistance is large.

The operational frequency of the IC may be on the order of several hundreds of mega-hertz (MHz) to several giga-hertz (GHz). In such circuits, the rising time of clock signals is very short, and voltage fluctuations in the supply line may be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or de-coupling capacitors are usually used between the different power supply lines or between the power supply line and the ground line. De-coupling capacitors act as charge reservoirs that additionally supply currents to circuits to prevent momentary drops in supply voltage.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
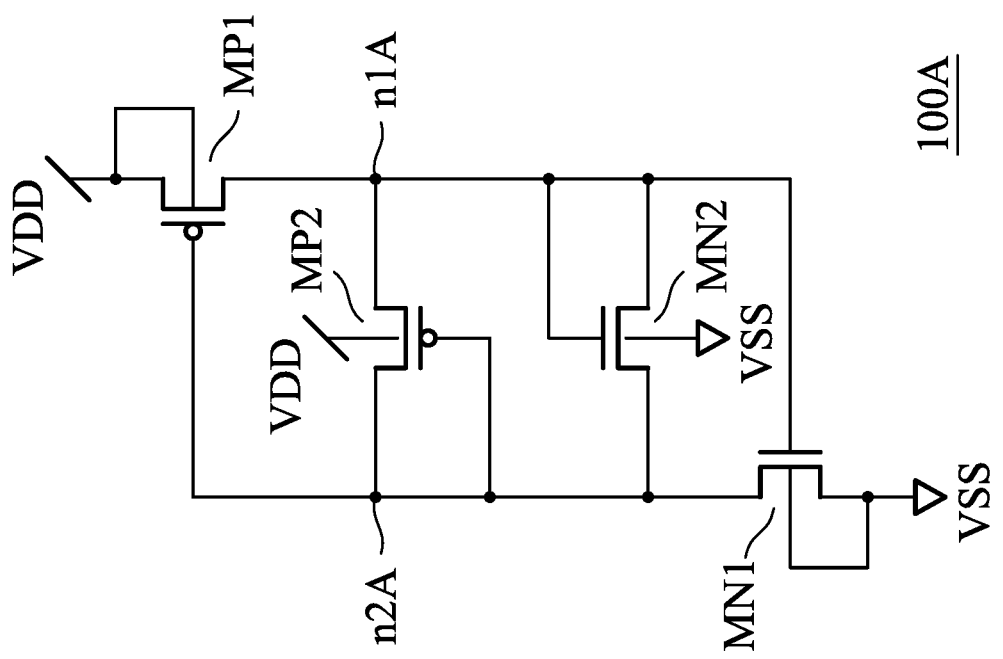
FIG. 1 shows a capacitor cell, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a capacitor cell 100A, which may serve as a de-coupling capacitor, in accordance with some embodiments of the disclosure. The capacitor cell 100A is capable of providing the capacitance for decreasing noise in the power supply lines in an integrated circuit (IC).

The capacitor cell 100A includes a PMOS transistor MP1 and an NMOS transistor MN1. The PMOS transistor MP1 is coupled between a power supply VDD and a first node n1A, and a gate of the PMOS transistor MP1 is coupled to a second node n2A. The NMOS transistor MN1 is coupled between a ground VSS and the second node n2A, and a gate of the NMOS transistor MN1 is coupled to the first node n1A. The PMOS transistor MP1 and the NMOS transistor MN1 form a cross-coupled de-coupling structure, which provides the MOS capacitance with a series channel-resistance for increasing the electrostatic discharge (ESD) protection and decreasing gate leakage current.

The capacitor cell 100A further includes a PMOS transistor MP2 and an NMOS transistor MN2. The PMOS transistor MP2 is coupled between the first node n1A and the second node n2A, and a gate of the PMOS transistor MP2 is coupled to the drain of the NMOS transistor MN1 via the second node n2A. The NMOS transistor MN2 is also coupled between the first node n1A and the second node n2A, and a gate of the NMOS transistor MN2 is coupled to the drain of the PMOS transistor MP1 via the first node n1A.

In some embodiments, in the capacitor cell 100A, bulks of the PMOS transistors MP1 and MP2 are coupled to the power supply VDD, and bulks of the NMOS transistors MN1 and MN2 are coupled to the ground VSS. In some embodiments, the bulks of the PMOS transistors MP1 and MP2 and the bulks of the PMOS transistors MP1 and MP2 are coupled to the other voltages. For example, the bulks of the PMOS transistors MP1 and MP2 are both coupled to other voltage, or the bulks of the PMOS transistors MP1 and MP2 are coupled to different voltages.

Figure 2A:
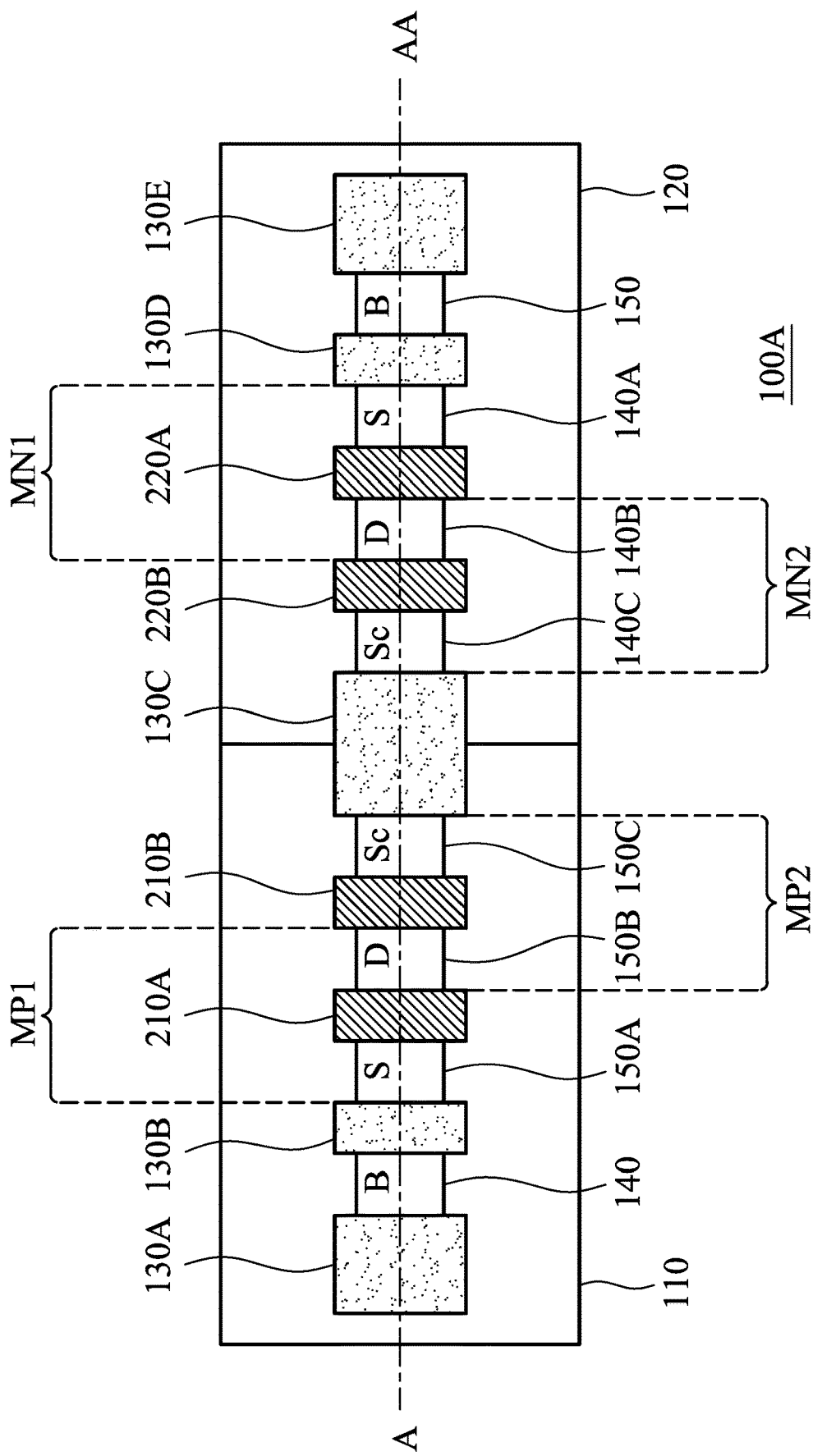
FIG. 2A shows a top view of the capacitor cell of FIG. 1, in accordance with some embodiments of the disclosure.
Figure 2B:
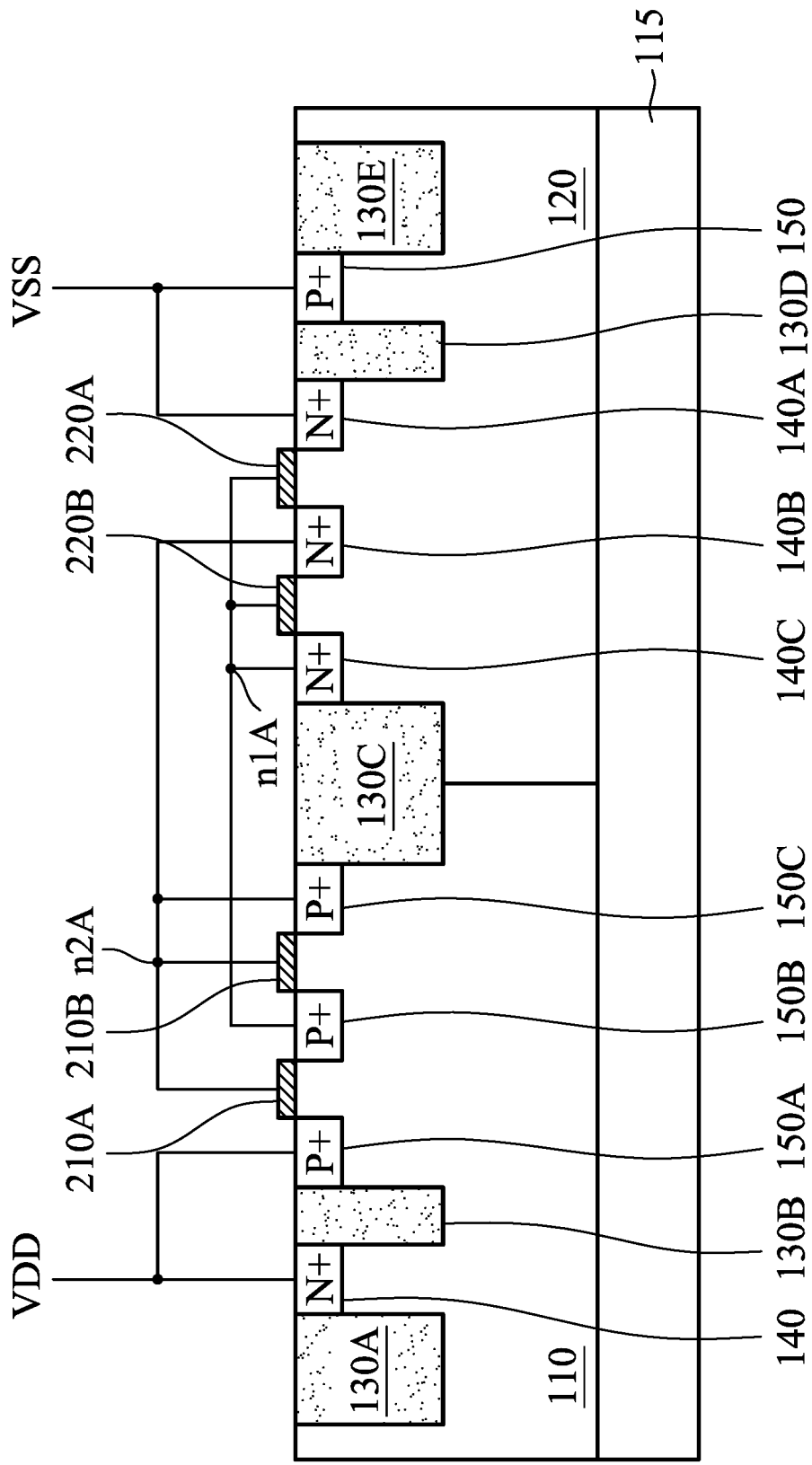
FIG. 2B shows a cross-sectional view along line A-AA of FIG. 2A.

FIG. 2A shows a top view of the capacitor cell 100A of FIG. 1, in accordance with some embodiments of the disclosure, and FIG. 2B shows a cross-sectional view along line A-AA of FIG. 2A.

Referring to FIG. 1, FIG. 2A and FIG. 2B together, an array of transistors in an N-type well 110 on a P-type substrate 115 form the PMOS transistors MP1 and MP2. An N+ doped region 140 is formed in the N-type well 110 and between two isolation regions 130A and 130B, such as a shallow trench isolation (STI). In some embodiments, the N-type well 110 is coupled to the power supply VDD via the N+ doped region 140, and the N-type well 110 forms a bulk (or a base) B of the PMOS transistors MP1 and MP2. In order to simplify the description, the contacts, vias and metals between the N+ doped region 140, the P+ doped regions 150A-150C, the first node n1A, the second node n2A and the power supply VDD are omitted.

The P+ doped regions 150A, 150B and 150C are formed in the N-type well 110, and the P+ doped region 150B is disposed between the P+ doped regions 150A and 150C. The gate metals 210A and 210B are formed on the N-type well 110.

The gate metal 210A is disposed between the P+ doped regions 150A and 150B. In some embodiments, the gate metal 210A and the P+ doped regions 150A and 150B form the PMOS transistor MP1. The P+ doped region 150A is coupled to the power supply VDD, and forms a source region S for the PMOS transistor MP1. The P+ doped region 150B is coupled to the first node n1A, and P+ doped region 150B forms a drain region D for the PMOS transistor MP1. For the PMOS transistor MP1, the gate metal 210A is coupled to the second node n2A, and an active region (e.g. a channel) of the PMOS transistor MP1 is formed between the P+ doped regions 150A and 150B. In some embodiments, the PMOS transistor MP1 is formed by multiple PMOS transistors coupled in parallel, and the configurations of the PMOS transistors coupled in parallel are similar to that of the PMOS transistor MP1.

The gate metal 210B is disposed between the P+ doped regions 150B and 150C. In some embodiments, the gate metal 210B and the P+ doped regions 150B and 150C form the PMOS transistor MP2. The P+ doped region 150B is coupled to the first node n1A, and P+ doped region 150B forms a drain region D for the PMOS transistor MP2. The P+ doped region 150C is coupled to the second node n2A, and P+ doped region 150C forms a source region Sc for the PMOS transistor MP2. For the PMOS transistor MP2, the gate metal 210B is coupled to the second node n2A, and an active region (e.g. a channel) of the PMOS transistor MP2 is formed between the P+ doped regions 150B and 150C. In some embodiments, the PMOS transistor MP2 is formed by multiple PMOS transistors coupled in parallel, and the configurations of the PMOS transistors coupled in parallel are similar to that of the PMOS transistor MP2.

An array of transistors in a P-type well 120 on the P-type substrate 115 forms the NMOS transistors MN1 and MN2. A P+ doped region 150 is formed in the P-type well 120 and between two isolation regions 130D and 130E, such as an STI. In some embodiments, the P-type well 120 is coupled to the ground VSS via the P+ doped region 150, and the P-type well 120 forms a bulk (or a base) B of the NMOS transistors MN1 and MN2. In order to simplify the description, the contacts, vias and metals between the P+ doped region 150, the N+ doped regions 140A-140C, the first node n1A, the second node n2A, and the ground VSS are omitted.

The N+ doped regions 140A, 140B and 140C are formed in the P-type well 120, and the N+ doped region 140B is disposed between the N+ doped regions 140A and 140C. The gate metals 220A and 220B are formed on the P-type well 120.

The gate metal 220A is disposed between the N+ doped regions 140A and 140B. In some embodiments, the gate metal 220A and the N+ doped regions 140A and 140B form the NMOS transistor MN1. The N+ doped region 140A is coupled to the ground VSS, and N+ doped region 140A forms a source region S for the NMOS transistor MN1. The N+ doped region 140B is coupled to the second node n2A, and N+ doped region 140B forms a drain region D for the NMOS transistor MN1. For the NMOS transistor MN1, the gate metal 220A is coupled to the first node n1A, and an active region (e.g. a channel) of the NMOS transistor MN1 is formed between the N+ doped regions 140A and 140B. In some embodiments, the NMOS transistor MN1 is formed by multiple NMOS transistors coupled in parallel, and the configurations of the NMOS transistors coupled in parallel are similar to that of the NMOS transistor MN1.

The gate metal 220B is disposed between the N+ doped regions 140B and 140C. In some embodiments, the gate metal 220B and the N+ doped regions 140B and 140C form the NMOS transistor MN2. The N+ doped region 140B is coupled to the second node n2A, and N+ doped region 140B forms a drain region D for the NMOS transistor MN2. The N+ doped region 140C is coupled to the first node n1A, and N+ doped region 140C forms a source region Sc for the NMOS transistor MN2. Furthermore, the source region Sc (e.g. the N+ doped region 140C) of the NMOS transistor MN2 is separated from the source region Sc (e.g. the P+ doped region 150C) of the PMOS transistor MP2 by the isolation region 130C. For the NMOS transistor MN2, the gate metal 220B is coupled to the first node n1A, and an active region (e.g. a channel) of the NMOS transistor MN2 is formed between the N+ doped regions 140B and 140C. In some embodiments, the NMOS transistor MN2 is formed by multiple NMOS transistors coupled in parallel, and the configurations of the NMOS transistors coupled in parallel are similar to that of the NMOS transistor MN2.

In such embodiments, the source regions S/Sc and the drain regions D are interlaced to form an array or a row of the PMOS transistors in the N-type well 110, and the source regions S/Sc and the drain regions D are interlaced to form an array or a row of the NMOS transistors in the P-type well 120. In some embodiments, the number of PMOS transistors is identical to the number of NMOS transistors. In some embodiments, the PMOS transistors in the N-type well 110 and the NMOS transistors in the P-type well 120 are arranged in the same row. In some embodiments, the PMOS transistors in the N-type well 110 and the NMOS transistors in the P-type well 120 are arranged in adjacent rows.

In some embodiments, the source region S of the PMOS transistor MP1 is coupled to the power supply VDD, and the source region Sc of the PMOS transistor MP2 is coupled to the drain region D of the NMOS transistor MN1 via the second node n2A. Therefore, the configurations of the source regions S and Sc are different for the PMOS transistors MP1 and MP2. Furthermore, the gates of the PMOS transistors MP1 and MP2 are coupled to the drain region D of the NMOS transistor MN1 via the second node n2A. The drain regions D of the PMOS transistors MP1 and MP2 are coupled to the gate of the NMOS transistors MN1 and MN2 via the first node n1A.

Similarly, the source region S of the NMOS transistor MN1 is coupled to the ground VSS, and the source region Sc of the NMOS transistor MN2 is coupled to the drain region D of the PMOS transistor MP1 via the first node n1A. Therefore, the configurations of the source regions S and Sc are different for the NMOS transistors MN1 and MN2. Furthermore, the gates of the NMOS transistors MN1 and MN2 are coupled to the drain region D of the PMOS transistor MP1 via the first node n1A. The drain regions D of the NMOS transistors MN1 and MN2 are coupled to the gate of the PMOS transistors MP1 and MP2 via the second node n2A.

In some embodiments, the PMOS transistors MP1 and MP2 are formed by multiple PMOS transistors coupled in parallel in the array of transistors in the N-type well 110. Similarly, the NMOS transistors MN1 and MN2 are formed by multiple NMOS transistors coupled in parallel in the array of transistors in the P-type well 120.

Figure 3:
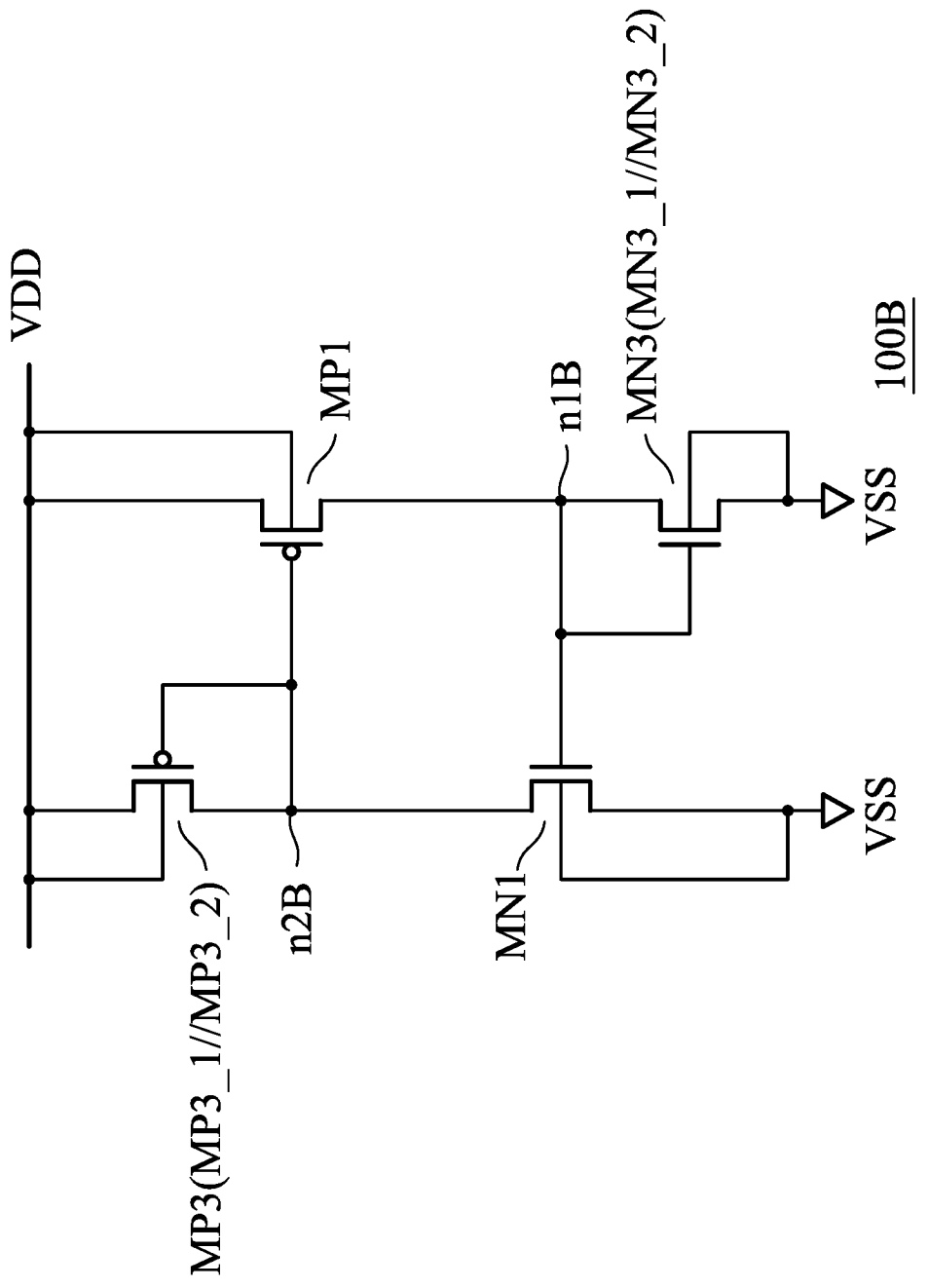
FIG. 3 shows a capacitor cell, in accordance with some embodiments of the disclosure.

FIG. 3 shows a capacitor cell 100B, which may serve as a de-coupling capacitor, in accordance with some embodiments of the disclosure. The capacitor cell 100B is capable of providing capacitance for decreasing noise in the power supply.

The capacitor cell 100B includes a PMOS transistor MP1 coupled between a power supply VDD and a first node n1B, and an NMOS transistor MN1 coupled between a ground VSS and a second node n2B. A gate of the PMOS transistor MP1 is coupled to the second node n2B, and a gate of the NMOS transistor MN1 is coupled to the first node n1B. The PMOS transistor MP1 and the NMOS transistor MN1 form a cross-coupled de-coupling structure for increasing the ESD protection and decreasing gate leakage current.

The capacitor cell 100B further includes a PMOS transistor MP3 and an NMOS transistor MN3. The PMOS transistor MP3 is coupled between the power supply VDD and the second node n2B, and a gate of the PMOS transistor MP3 is coupled to the second node n2B. The NMOS transistor MN3 is coupled between the first node n1B and the ground VSS, and a gate of the NMOS transistor MN3 is coupled to the first node n1B.

In some embodiments, the PMOS transistors MP1 and MP3 are formed by multiple PMOS transistors coupled in parallel, and the NMOS transistors MN1 and MN3 are formed by multiple NMOS transistors coupled in parallel. For example, the PMOS transistor MP3 is formed by the PMOS transistors MP3_1 and MP3_2 coupled in parallel (MP3_1//MP3_2), and the NMOS transistor MN3 is formed by the NMOS transistors MN3_1 and MN3_2 coupled in parallel (MN3_1//MN3_2). The PMOS transistors MP3_1 and MP3_2 and the NMOS transistors MN3_1 and MN3_2 will be discussed in details later.

In the capacitor cell 100B, bulks of the PMOS transistors MP1 and MP3 are coupled to the power supply VDD, and bulks of the NMOS transistors MN1 and MN3 are coupled to the ground VSS.

Figure 4A:
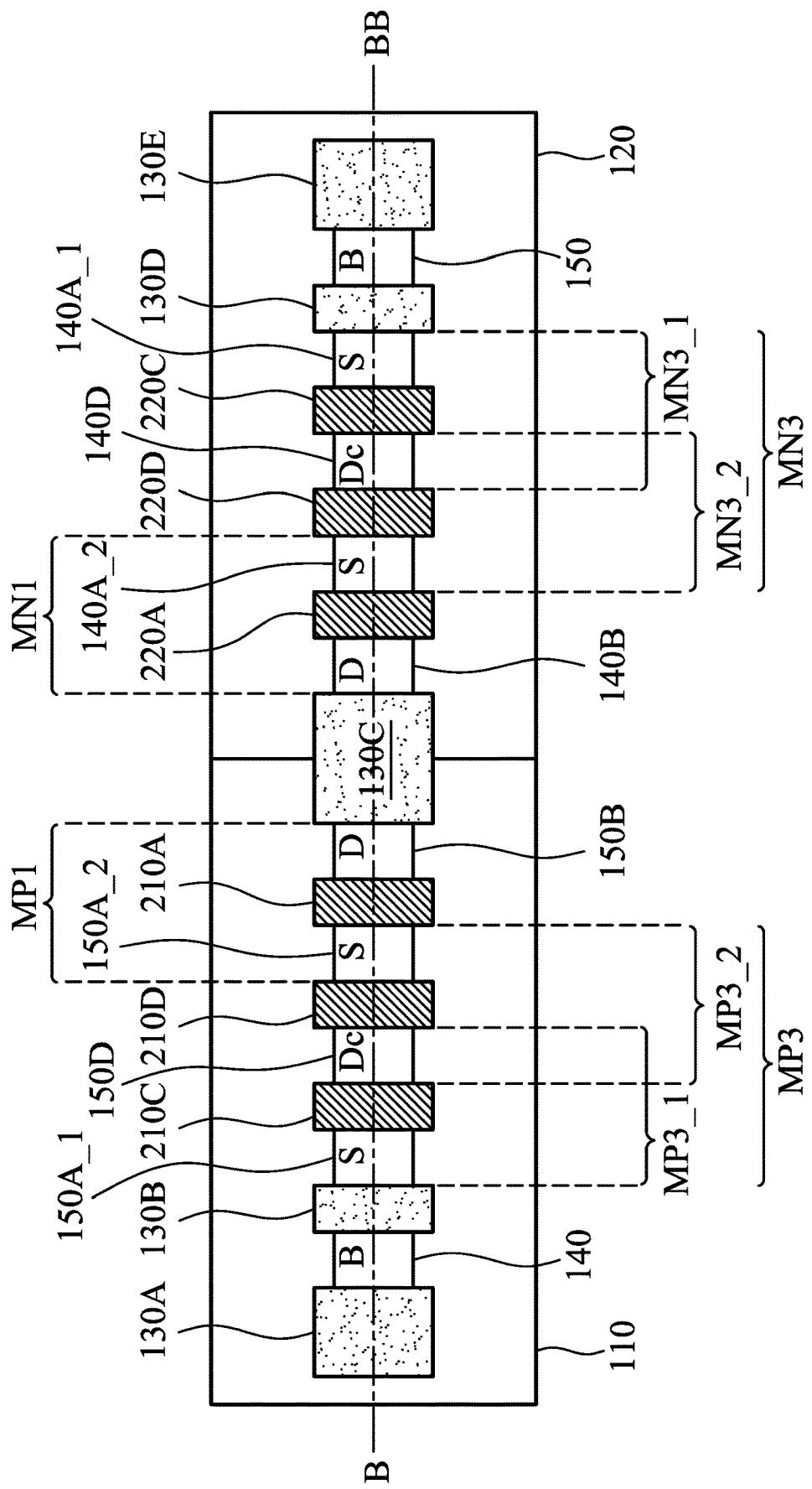
FIG. 4A shows a top view of the capacitor cell of FIG. 3, in accordance with some embodiments of the disclosure.
Figure 4B:
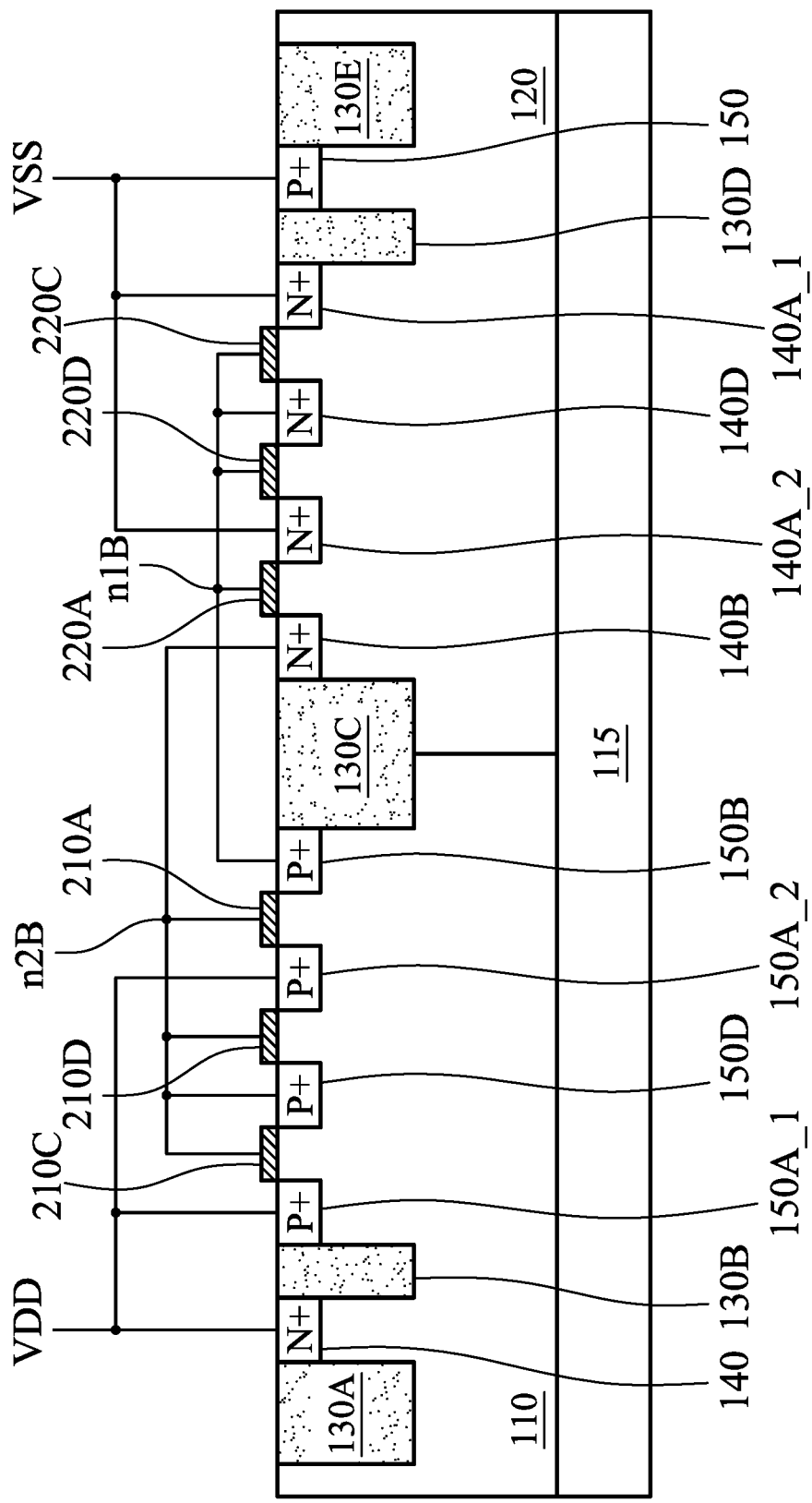
FIG. 4B shows a cross-sectional view along line B-BB of FIG. 4A.

FIG. 4A shows a top view of the capacitor cell 100B of FIG. 3, in accordance with some embodiments of the disclosure, and FIG. 4B shows a cross-sectional view along line B-BB of FIG. 4A.

Referring to FIG. 3, FIG. 4A and FIG. 4B together, an array of transistors in an N-type well 110 on a P-type substrate 115 form the PMOS transistors MP1, and MP3 in which MP3 is formed by MP3_1 and MP3_2 coupled in parallel. An N+ doped region 140 is formed in the N-type well 110 and between two isolation regions 130A and 130B, such as an STI. In some embodiments, the N-type well 110 is coupled to the power supply VDD via the N+ doped region 140, and the N-type well 110 forms a bulk B (or a base) of the PMOS transistors MP1, MP3_1 and MP3_2. In order to simplify the description, the contacts, vias and metals between the N+ doped region 140, the P+ doped regions 150A_1, 150A_2, 150B and 150D, the first node n1B, the second node n2B, and the power supply VDD are omitted.

The P+ doped regions 150A_1, 150A_2, 150B and 150D are formed in the N-type well 110. The P+ doped region 150D is disposed between the P+ doped regions 150A_1 and 150A_2, and the P+ doped region 150A_2 is disposed between the P+ doped regions 150D and 150B. The gate metals 210C, 210D and 210A are formed on the N-type well 110.

The gate metal 210C is disposed between the P+ doped regions 150A_1 and 150D. In some embodiments, the gate metal 210C and the P+ doped regions 150A_1 and 150D form a PMOS transistor MP3_1. The P+ doped region 150A_1 is coupled to the power supply VDD, and P+ doped region 150A_1 forms a source region S for the PMOS transistor MP3_1. The P+ doped region 150D is coupled to the second node n2B, and P+ doped region 150D forms a drain region Dc for the PMOS transistor MP3_1. For the PMOS transistor MP3_1, the gate metal 210C is coupled to the second node n2B, and an active region (e.g. a channel) of the PMOS transistor MP3_1 is formed between the P+ doped regions 150A_1 and 150D.

The gate metal 210D is disposed between the P+ doped regions 150D and 150A_2. In some embodiments, the gate metal 210D and the P+ doped regions 150D and 150A_2 form the PMOS transistor MP3_2. The P+ doped region 150D is coupled to the second node n2B, and P+ doped region 150D forms a drain region Dc for the PMOS transistor MP3_2. The P+ doped region 150A_2 is coupled to the power supply VDD, and P+ doped region 150A_2 forms a source region S for the PMOS transistor MP3_2. For the PMOS transistor MP3_2, the gate metal 210D is coupled to the second node n2B, and an active region (e.g. a channel) of the PMOS transistor MP3_2 is formed between the P+ doped regions 150D and 150A_2.

The gate metal 210A is disposed between the P+ doped regions 150A_2 and 150B. In some embodiments, the gate metal 210A and the P+ doped regions 150A_2 and 150B form the PMOS transistor MP1. The P+ doped region 150A_2 is coupled to the power supply VDD, and P+ doped region 150A_2 forms a source region S for the PMOS transistor MP1. The P+ doped region 150B is coupled to the first node n1B, and P+ doped region 150B forms a drain region D for the PMOS transistor MP1. For the PMOS transistor MP1, the gate metal 210A is coupled to the second node n2B, and an active region (e.g. a channel) of the PMOS transistor MP1 is formed between the P+ doped regions 150B and 150A_2.

An array of transistors in a P-type well 120 on the P-type substrate 115 forms the NMOS transistors MN1, and MN3 in which MN3 is formed by MN3_1 and MN3_2 coupled in parallel. A P+ doped region 150 is formed in the P-type well 120 and between two isolation regions 130D and 130E, such as an STI. In some embodiments, the P-type well 120 is coupled to the ground VSS via the P+ doped region 150, and the P-type well 120 forms a bulk (or a base) B of the NMOS transistors MN1 and MN3. In order to simplify the description, the contacts, vias and metals between the P+ doped region 150, the N+ doped regions 140A_1, 140A_2, 140B and 140D, the first node n1B, the second node n2B, and the ground VSS are omitted.

The N+ doped regions 140A_1, 140A_2, 140B and 140D are formed in the P-type well 120. The N+ doped region 140A_2 is disposed between the N+ doped regions 140B and 140D, and the N+ doped region 140D is disposed between the N+ doped regions 140A_2 and 140A_1. The gate metals 220C, 220D and 220A are formed on the P-type well 120.

The gate metal 220C is disposed between the N+ doped regions 140A_1 and 140D. In some embodiments, the gate metal 220C and the N+ doped regions 140A_1 and 140D form the NMOS transistor MN3_1. The N+ doped region 140A_1 is coupled to the ground VSS, and N+ doped region 140A_1 forms a source region S for the NMOS transistor MN3_1. The N+ doped region 140D is coupled to the first node n1B, and N+ doped region 140D forms a drain region Dc for the NMOS transistor MN3_1. For the NMOS transistor MN3_1, the gate metal 220C is coupled to the first node n1B, and an active region (e.g. a channel) of the NMOS transistor MN3_1 is formed between the N+ doped regions 140A_1 and 140D.

The gate metal 220D is disposed between the N+ doped regions 140D and 140A_2. In some embodiments, the gate metal 220D and the N+ doped regions 140D and 140A_2 form the NMOS transistor MN3_2. The N+ doped region 140D is coupled to the first node n1B, and N+ doped region 140D forms a drain region Dc for the NMOS transistor MN3_2. The N+ doped region 140A_2 is coupled to the ground VSS, and N+ doped region 140A_2 forms a source region S for the NMOS transistor MN3_2. For the NMOS transistor MN3_2, the gate metal 220D is coupled to the first node n1B, and an active region (e.g. a channel) of the NMOS transistor MN3_2 is formed between the N+ doped regions 140D and 140A_2.

The gate metal 220A is disposed between the N+ doped regions 140A_2 and 140B. In some embodiments, the gate metal 220A and the N+ doped regions 140A_2 and 140B form the NMOS transistor MN1. The N+ doped region 140A_2 is coupled to the ground VSS, and N+ doped region 140A_2 forms a source region S for the NMOS transistor MN1. The N+ doped region 140B is coupled to the second node n2B, and N+ doped region 140B forms a drain region D for the NMOS transistor MN1. For the NMOS transistor MN1, the gate metal 220A is coupled to the first node n1B, and an active region (e.g. a channel) of the NMOS transistor MN1 is formed between the N+ doped regions 140A_2 and 140B.

In such embodiments, the source regions S and the drain regions D/Dc are interlaced to form an array or a row of the PMOS transistors in the N-type well 110, and the source regions S and the drain regions D/Dc are interlaced to form an array or a row of the NMOS transistors in the P-type well 120. In some embodiments, the number of PMOS transistors is identical to the number of NMOS transistors. In some embodiments, the PMOS transistors in the N-type well 110 and the NMOS transistors in the P-type well 120 are arranged in the same row. In some embodiments, the PMOS transistors in the N-type well 110 and the NMOS transistors in the P-type well 120 are arranged in the adjacent rows.

In some embodiments, the drain region D of the PMOS transistor MP1 is coupled to the gate of the NMOS transistor MN1 via the first node n1B, and the drain region Dc of the PMOS transistor MP3 (e.g. MP3_1//MP3_2) are coupled to the drain region D of the NMOS transistor MN1. Therefore, the configurations of the drain regions D and Dc are different for the PMOS transistors MP1 and MP3 (e.g. MP3_1//MP3_2). Furthermore, the gates of the PMOS transistors MP1 and MP3 are coupled to the drain region D of the NMOS transistor MN1 via the second node n2B. The source regions S of the PMOS transistors MP1 and MP3 are coupled to the power supply VDD.

Similarly, the drain region D of the NMOS transistor MN1 is coupled to the gate of the PMOS transistor MP1 via the second node n2B, and the drain region Dc of the NMOS transistor MN3 (e.g. MN3_1//MN3_2) is coupled to the drain region D of the PMOS transistor MP1 via the first node n1B. Therefore, the configurations of the drain regions D and Dc are different for the NMOS transistors MN1 and MN3. Furthermore, the gates of the NMOS transistors MN1 and MN3 are coupled to the drain region D of the PMOS transistor MP1 via the first node n1B. The source regions S of the NMOS transistors MN1 and MN3 are coupled to the ground VSS.

In some embodiments, the PMOS transistors MP1 and MP3 are formed by multiple PMOS transistors coupled in parallel in the array of transistors in the N-type well 110. Similarly, the NMOS transistors MN1 and MN3 are formed by multiple NMOS transistors coupled in parallel in the array of transistors in the P-type well 120.

Figure 5A:
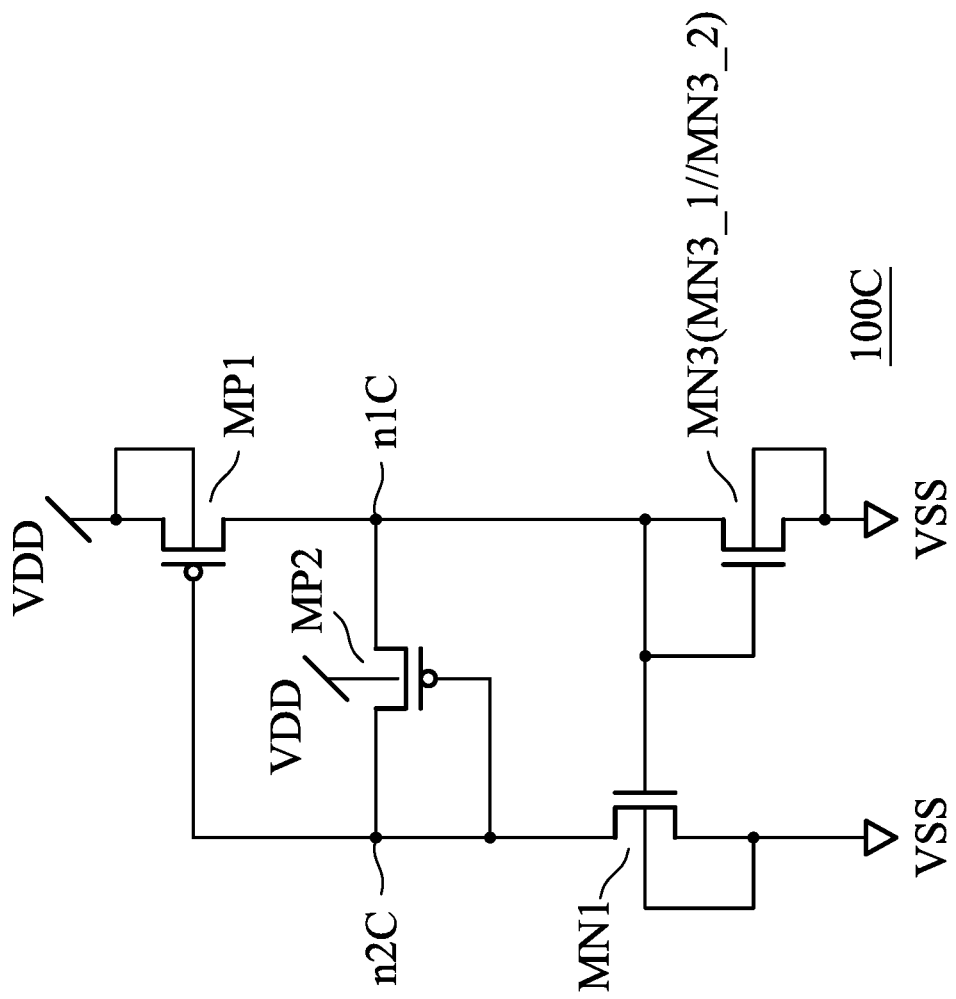
FIG. 5A shows a capacitor cell, in accordance with some embodiments of the disclosure.

FIG. 5A shows a capacitor cell 100C, which may serve as a de-coupling capacitor, in accordance with some embodiments of the disclosure. The capacitor cell 100C is capable of providing the capacitance for decreasing noise in a power supply.

The capacitor cell 100C includes a PMOS transistor MP1 coupled between a power supply VDD and a first node n1C and an NMOS transistor MN1 coupled between a ground VSS and a second node n2C. A gate of the PMOS transistor MP1 is coupled to the second node n2C, and a gate of the NMOS transistor MN1 is coupled to the first node n1C. The PMOS transistor MP1 and the NMOS transistor MN1 form a cross-coupled de-coupling structure for increasing the ESD protection and decreasing gate leakage current.

The capacitor cell 100C further includes a PMOS transistor MP2 and an NMOS transistor MN3 in which MN3 is formed by MN3_1 and MN3_2 coupled in parallel. The PMOS transistor MP2 is coupled between the first node n1C and the second node n2C, and a gate of the PMOS transistor MP2 is coupled to the second node n2C. The NMOS transistor MN3 is coupled between the first node n1C and the ground VSS, and a gate of the NMOS transistor MN3 is coupled to the first node n1C. Furthermore, the bulks of the PMOS transistors MP1 and MP2 are coupled to the power supply VDD, and the bulks of the NMOS transistors MN1 and MN3 are coupled to the ground VSS.

Figure 5B:
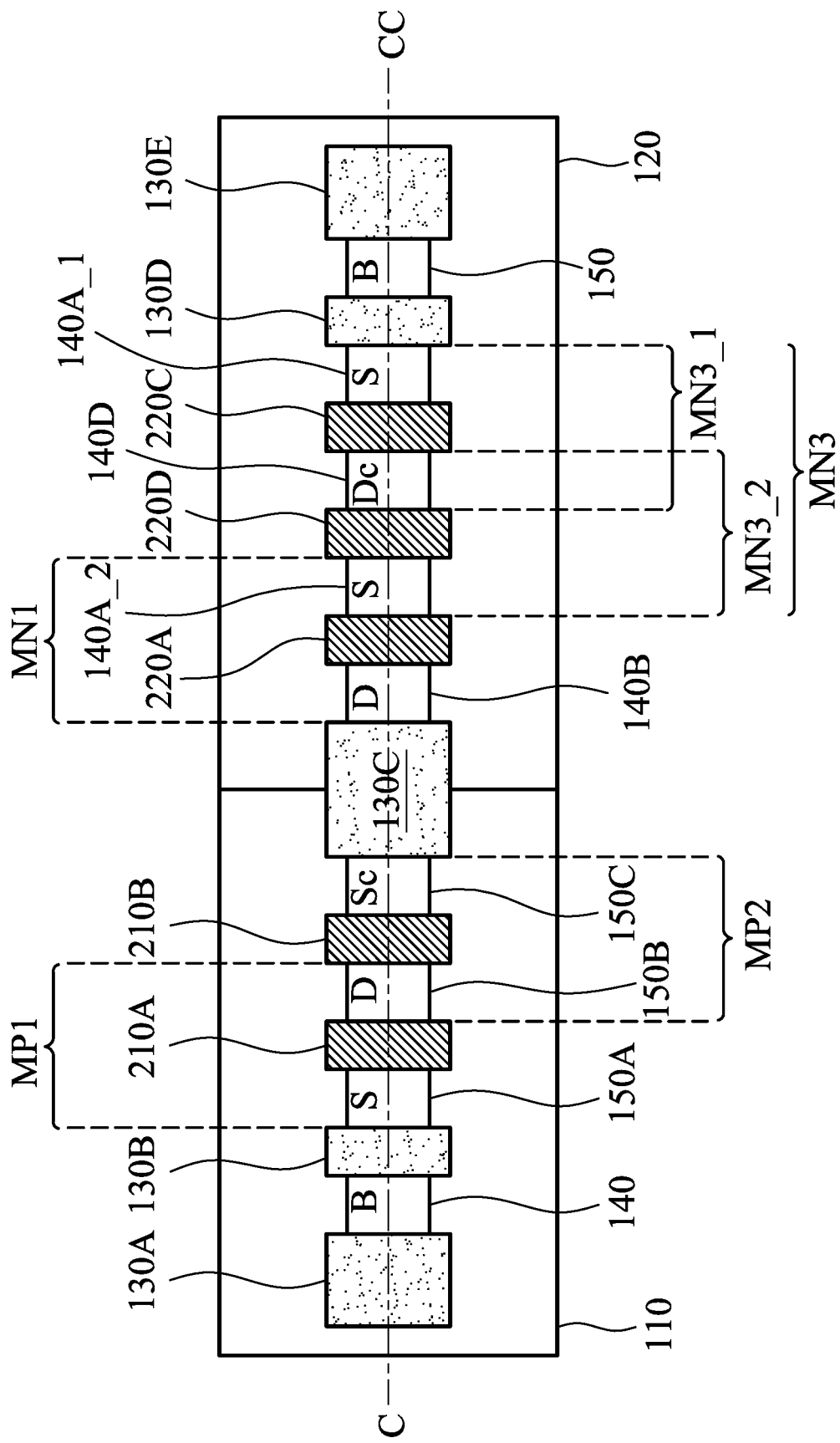
FIG. 5B shows a top view of the capacitor cell of FIG. 5A, in accordance with some embodiments of the disclosure.
Figure 5C:
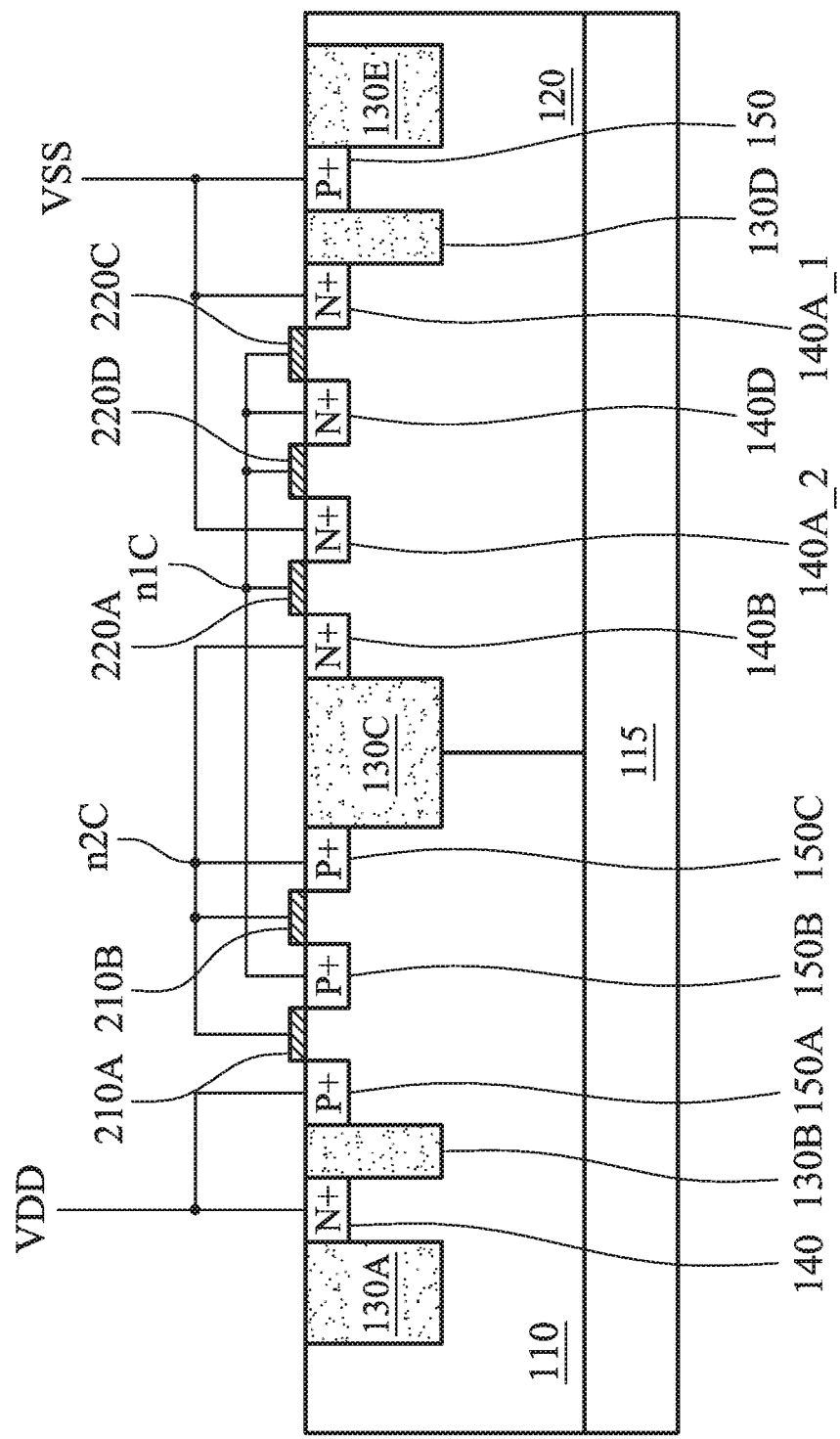
FIG. 5C shows a cross-sectional view along line C-CC of FIG. 5B.

FIG. 5B shows a top view of the capacitor cell 100C of FIG. 5A, in accordance with some embodiments of the disclosure, and FIG. 5C shows a cross-sectional view along line C-CC of FIG. 5B.

In FIG. 5B and FIG. 5C, configurations of the PMOS transistors MP1 and MP2 are similar to that of the PMOS transistors MP1 and MP2 in FIG. 2A and FIG. 2B. Furthermore, configurations of the NMOS transistors MN1 and MN3 are similar to that of the NMOS transistors MN1 and MN3 in FIG. 4A and FIG. 4B. For simplicity, the configurations of the PMOS transistors MP1 and MP2 and the NMOS transistors MN1 and MN3 will not be described.

Figure 6A:
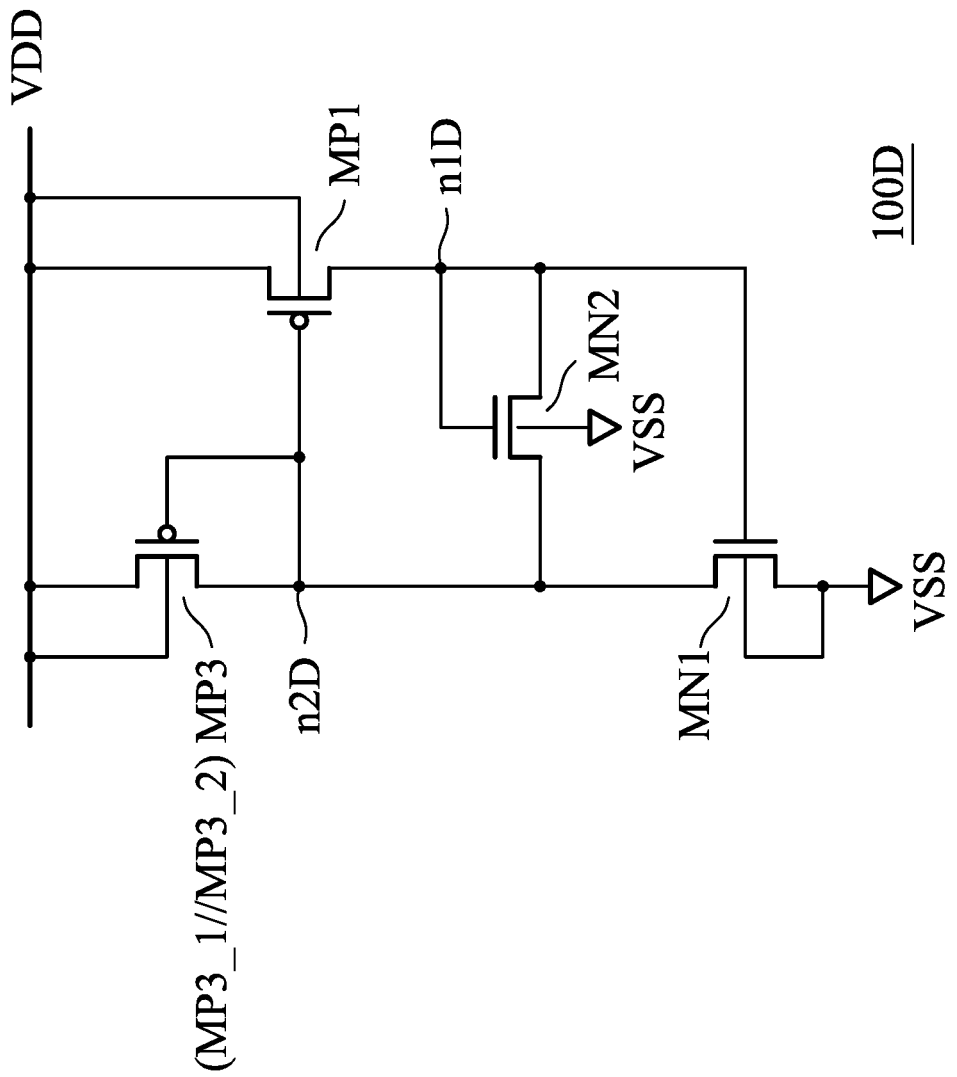
FIG. 6A shows a capacitor cell, in accordance with some embodiments of the disclosure.

FIG. 6A shows a capacitor cell 100D, which may serve as a de-coupling capacitor, in accordance with some embodiments of the disclosure. The capacitor cell 100D is capable of providing capacitance for decreasing noise in the power supply.

The capacitor cell 100D includes a PMOS transistor MP1 coupled between a power supply VDD and a first node n1D and an NMOS transistor MN1 coupled between a ground VSS and the node n2D. A gate of the PMOS transistor MP1 is coupled to a second node n2D, and a gate of the NMOS transistor MN1 is coupled to the first node n1D. The PMOS transistor MP1 and the NMOS transistor MN1 form a cross-coupled de-coupling structure for increasing the ESD protection and decreasing gate leakage current.

The capacitor cell 100D further includes a PMOS transistor MP3 in which MP3 is formed by MP3_1 and MP3_2 coupled in parallel, and an NMOS transistor MN2. The PMOS transistor MP3 is coupled between the power supply VDD and the second node n2D, and a gate of the PMOS transistor MP3 is coupled to the second node n2D. The NMOS transistor MN2 is coupled between the first node n1D and the second node n2D, and a gate of the NMOS transistor MN2 is coupled to the first node n1D. Furthermore, the bulks of the PMOS transistors MP1 and MP3 are coupled to the power supply VDD, and the bulks of the NMOS transistors MN1 and MN2 are coupled to the ground VSS.

Figure 6B:
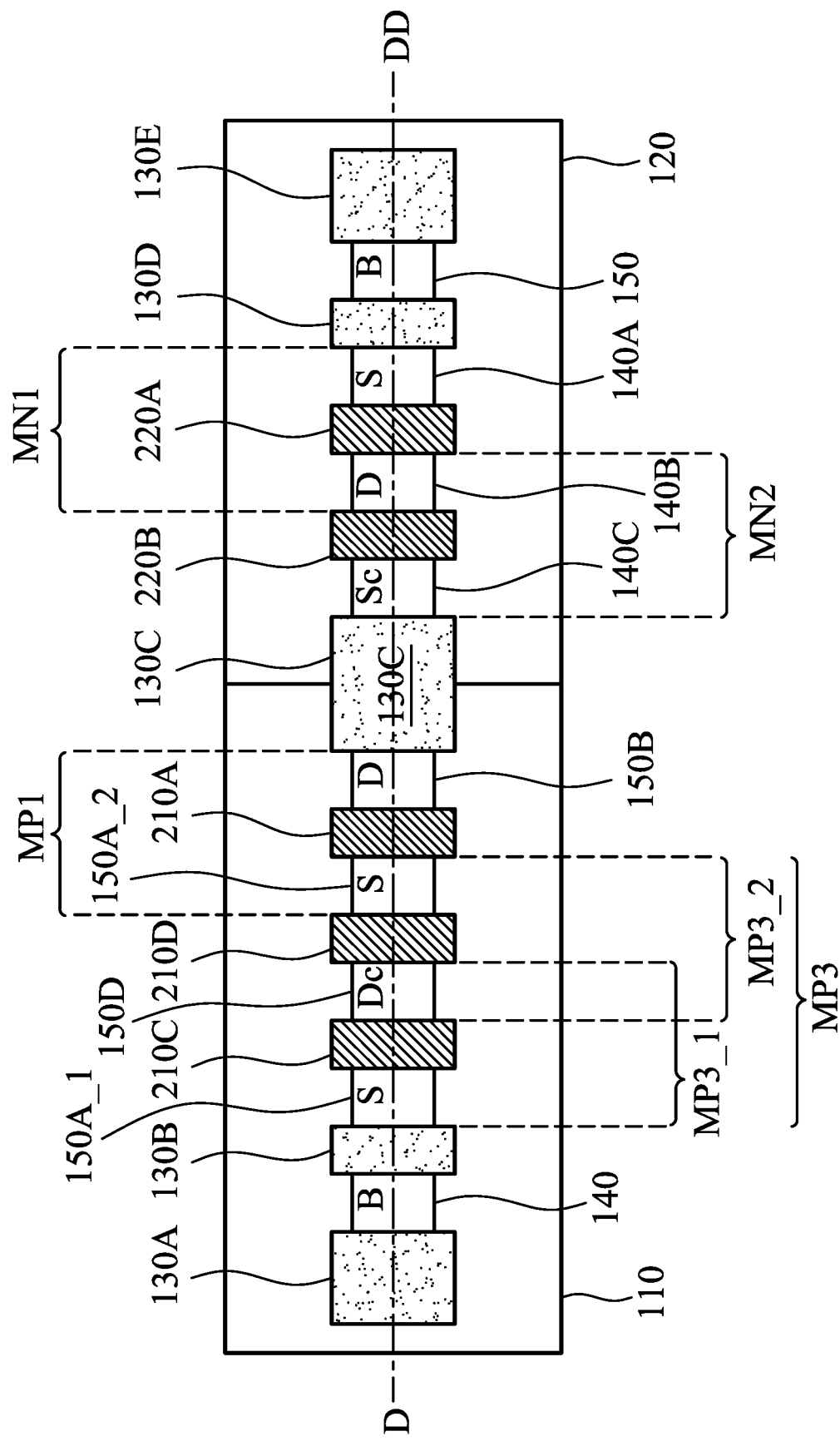
FIG. 6B shows a top view of the capacitor cell of FIG. 6A, in accordance with some embodiments of the disclosure.
Figure 6C:
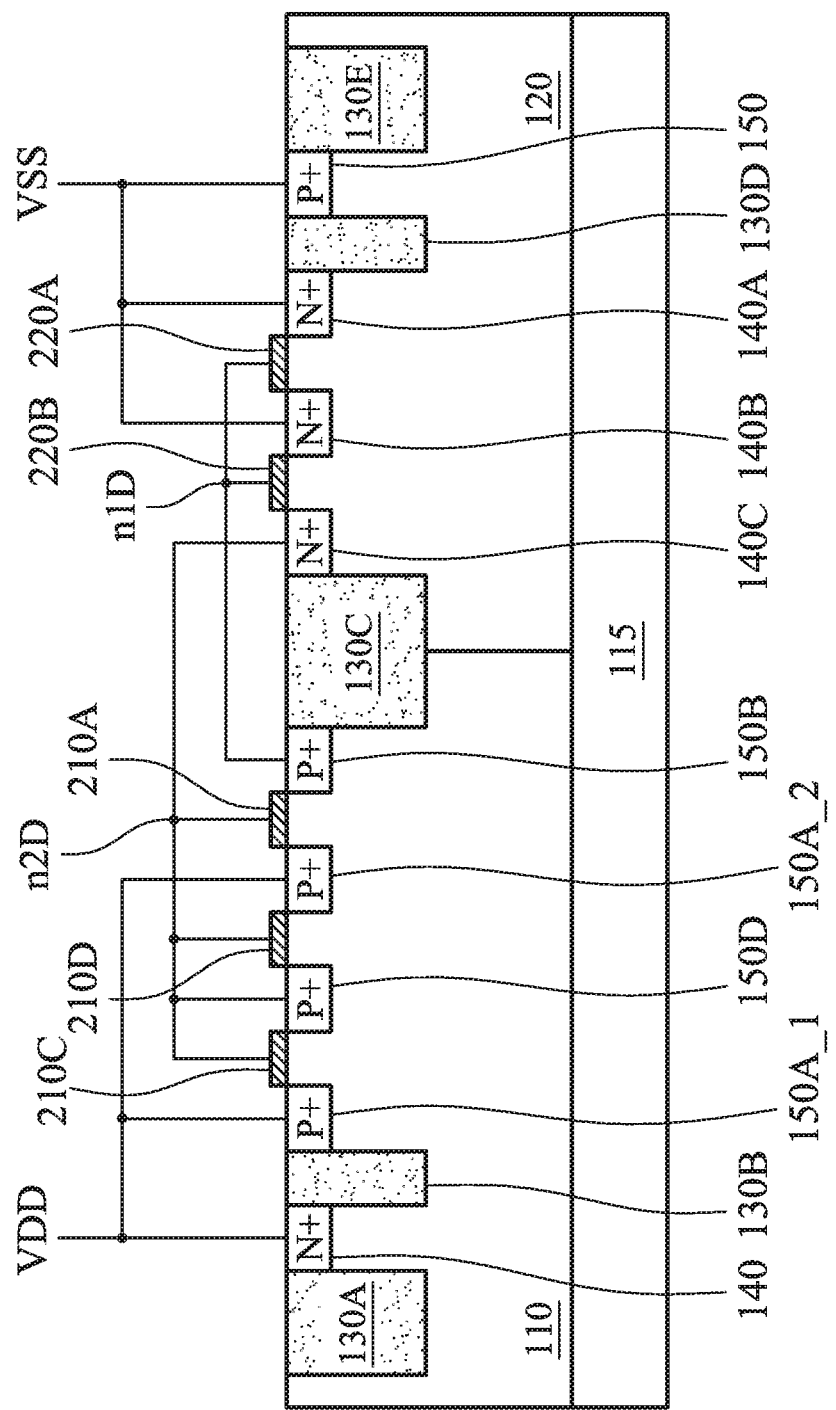
FIG. 6C shows a cross-sectional view along line D-DD of FIG. 6B.

FIG. 6B shows a top view of the capacitor cell 100D of FIG. 6A, in accordance with some embodiments of the disclosure, and FIG. 6C shows a cross-sectional view along line D-DD of FIG. 6B.

In FIG. 6B and FIG. 6C, configurations of the PMOS transistors MP1 and MP3 are similar to that of the PMOS transistors MP1 and MP3 in FIG. 4A and FIG. 4B. Furthermore, configurations of the NMOS transistors MN1 and MN2 are similar to that of the NMOS transistors MN1 and MN2 in FIG. 2A and FIG. 2B. For simplicity, the configurations of the PMOS transistors MP1 and MP3 and the NMOS transistors MN1 and MN2 will not be described.

A latch-up is a type of short circuit which can occur in an integrated circuit (IC). More specifically it is the inadvertent creation of a low-impedance path that causes high currents conducted between the power supply VDD and the ground VSS via a parasitic structure (e.g. a PNPN structure) in the IC. Latch-up may cause the IC to cease functioning and even to be destroyed. The parasitic PNPN structure acts as a PNP transistor and an NPN transistor stacked next to each other. When one of the PNP and NPN transistors is conducting, the other one begins conducting too, and an undesired latch-up occurs. Then the PNP and NPN transistors keep each other in saturation for as long as the structure is forward-biased and high current flows through the parasitic PNPN structure. In the embodiments, the capacitor cells 100A-100D can form the low resistance paths for enhancing latch-up immunity, and the low resistance paths will be described below.

Figure 7A:
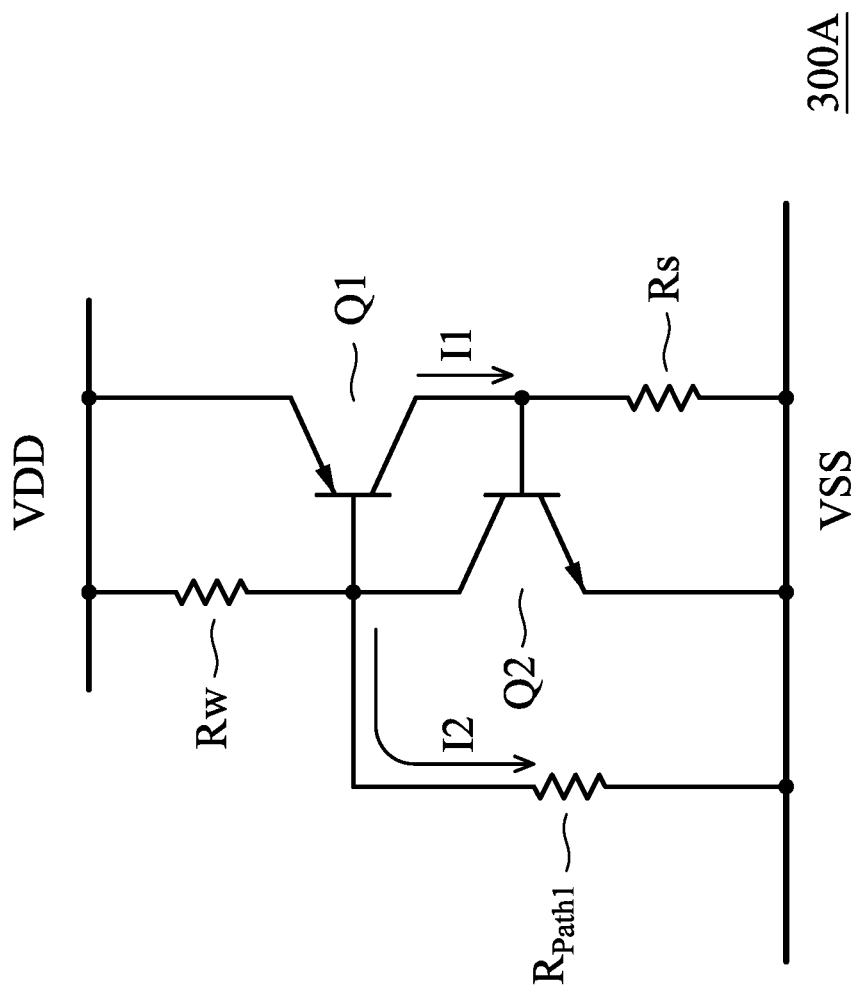
FIG. 7A shows a power noise triggered equivalent circuit of a silicon-controlled rectifier (SCR) in the capacitor cell of FIG. 1.
Figure 7B:
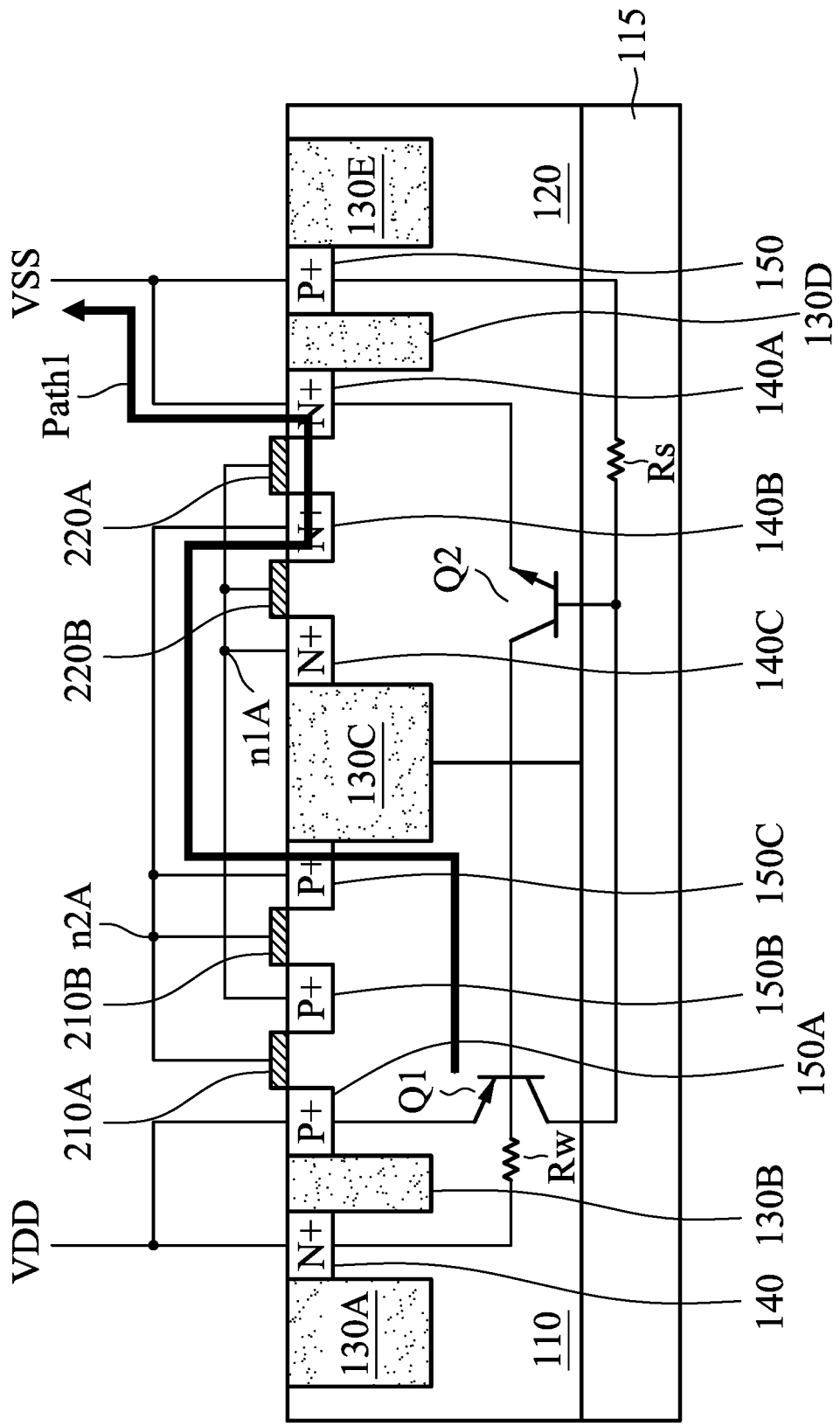
FIG. 7B shows a cross-sectional view illustrating the SCR of FIG. 7A.

FIG. 7A shows a power noise triggered equivalent circuit of a silicon-controlled rectifier (SCR) 300A in the capacitor cell 100A of FIG. 1, and FIG. 7B shows a cross-sectional view illustrating the SCR 300A of FIG. 7A.

Referring to FIG. 7A and FIG. 7B together, the SCR 300A includes two bipolar junction transistors (BJTs) Q1 and Q2, and the resistors Rw and Rs. The BJT Q1 is a PNP bipolar transistor formed by the P+ doped region 150A (e.g. the source region S of the PMOS transistor MP1), the N-type well 110, and the P-type substrate 115. The BJT Q2 is an NPN bipolar transistor formed by the N-type well 110, the P-type substrate 115, and the N+ doped region 140A (e.g. the source region S of the NMOS transistor MN1). The resistor Rw represents an equivalent resistance of the N-type well 110, and the resistor Rs represents an equivalent resistance of P-type substrate 115.

When the base-emitter junction of the BJT Q1 is forward-biased by a current or voltage noise from the power supply VDD, the BJT Q1 is turned on, and causes a collector current I1 of the BJT Q1. If the current I1 is large enough to turn on the BJT Q2, more current will be injected into the base region of the BJT Q1. Therefore, the BJTs Q1 and Q2 are in saturation mode and facilitate high current conduction from the power supply VDD to the ground VSS.

By adding the PMOS transistor MP2 and the NMOS transistors MN2 in the cross-coupled de-coupling structure formed by the PMOS transistor MP1 and the NMOS transistor MN1 in the capacitor cell 100A, a low resistance path Path1 is formed to discharge minority carriers in the base region of the BJTs Q1 and Q2 in the SCR 300A, and the resistor $R_{path}$ represents an equivalent resistance of the low resistance path Path1. When the BJT Q1 is turned on, a shunting current I2 is provided by the active collector of the BJT Q1 to discharge minority carriers injected by the base-emitter junction of the BJT Q1, thereby the current I1 from the BJT Q1 is decreased. Therefore, it uses higher collector current to turn on the BJT Q2. Furthermore, the base-emitter voltage $V_{BE}$ of the BJT Q1 for turning on the SCR 300A is increased.

In some embodiments, the low resistance path Path1 is provided by an N-channel conduction of one or more NMOS transistors within an array of transistors in the P-type well 120 via the source region Sc and/or the drain region Dc of one or more PMOS transistors within an array of transistors in the N-type well 110.

Taking the capacitor cell 100A having the source region Sc (e.g. P+ doped region 150C) in the N-type well 110 as an example, the low resistance path Path1 is formed from the N-type well 110 to the ground VSS through the P+ doped region 150C, the second node n2A, the N+ doped region 140B, the active region (e.g. N-channel) corresponding to the gate metal 220A, and the N+ doped region 140A in sequence. Therefore, the source region Sc or the drain region Dc of the PMOS transistor coupled to the drain region D of the NMOS transistor will form the low resistance path Path1 to discharge minority carriers in the base region of the BJT Q1, thereby the holding voltage and the trigger current that cause latch-up can be increased for latch-up protection, and the latch-up immunity is improved.

Figure 8A:
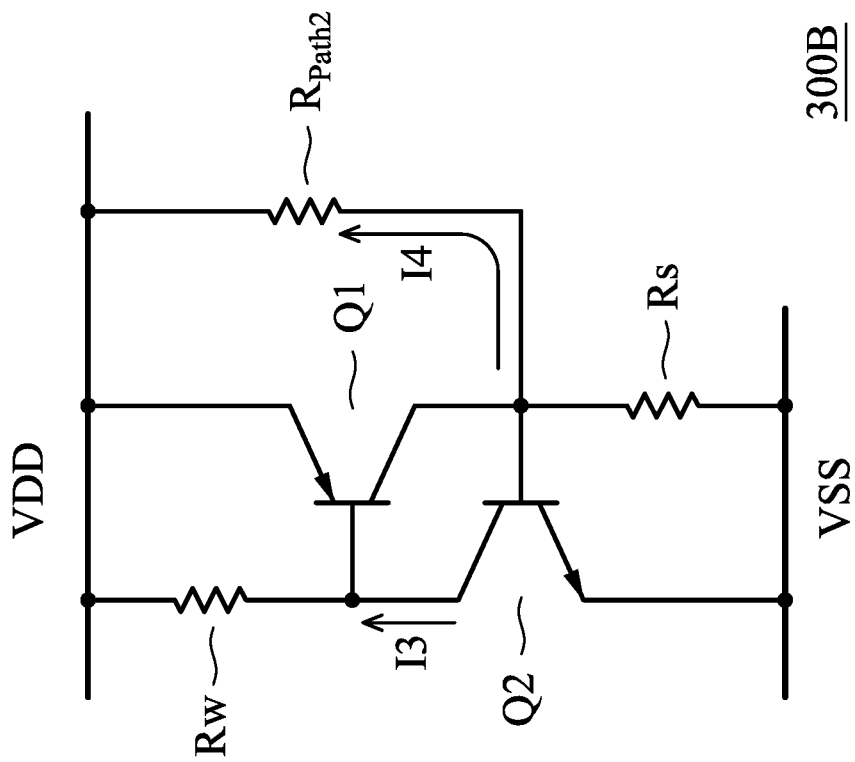
FIG. 8A shows a ground noise triggered equivalent circuit of a SCR in the capacitor cell of FIG. 1.
Figure 8B:
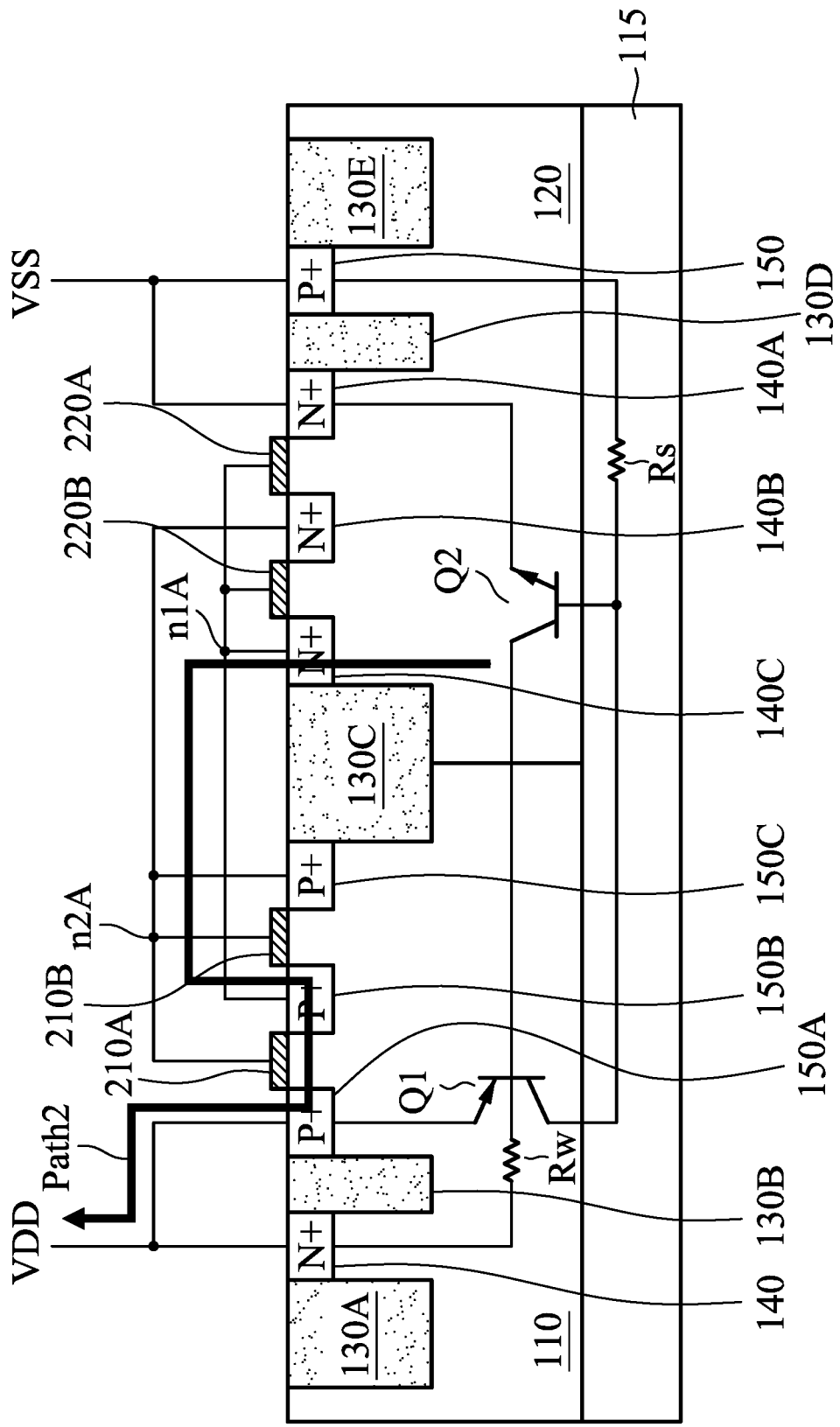
FIG. 8B shows a cross-sectional view illustrating the SCR of FIG. 8A.

FIG. 8A shows a ground noise triggered equivalent circuit of a SCR 300B in the capacitor cell 100A of FIG. 1, and FIG. 8B shows a cross-sectional view illustrating the SCR 300B of FIG. 8A.

Referring to FIG. 8A and FIG. 8B together, when the base-emitter junction of the BJT Q2 is forward-biased by a current or voltage noise from the ground VSS, the BJT Q2 is turned on, and causes a collector current I3 of the BJT Q2. If the current I3 is large enough to turn on the BJT Q1, more current will be injected into the base region of the BJT Q2. Therefore, the BJTs Q1 and Q2 are in saturation mode and facilitate high current conduction from the power supply VDD to the ground VSS.

By adding the PMOS transistor MP2 and the NMOS transistors MN2 in the cross-coupled de-coupling structure formed by the PMOS transistor MP1 and the NMOS transistor MN1 in the capacitor cell 100A, a low resistance path Path2 is formed to discharge minority carriers in the base region of the BJTs Q1 and Q2 in the SCR 300B, and the resistor $R_{Path2}$ represents an equivalent resistance of the low resistance path Path2. When the BJT Q2 is turned on, a shunting current I4 is provided by the active collector of the BJT Q2 to discharge minority carriers injected by the base-emitter junction of the BJT Q2, thereby the current I3 from the BJT Q2 is decreased. Therefore, it requires higher collector current to turn on the BJT Q1. Furthermore, the required base-emitter voltage $V_{BE}$ of the BJT Q2 for turning on the SCR 300B is increased.

In some embodiments, the low resistance path Path2 is provided by a P-channel conduction of one or more PMOS transistors within an array of transistors in the N-type well 110 via the source region Sc and/or the drain region Dc of one or more NMOS transistors within an array of transistors in the P-type well 120.

Taking the capacitor cell 100A having the source region Sc (e.g. N+ doped region 140C) in the P-type well 120 as an example, the low resistance path Path2 is formed from the P-type well 120 to the power supply VDD through the N+ doped region 140C, the first node n1A, the P+ doped region 150B, the active region (e.g. P-channel) corresponding to the gate metal 210A, and the P+ doped region 150A in sequence. Therefore, the source region Sc or the drain region Dc of the NMOS transistor coupled to the drain region D of the PMOS transistor will form the low resistance path Path2 to discharge minority carriers in the base region of the BJT Q2, thereby the holding voltage and the trigger current that cause latch-up can be increased for latch-up protection, and the latch-up immunity is improved.

For the PMOS transistor MP1 in the N-type well 110 and the NMOS transistor MN1 in the P-type well 120, the gates of the PMOS transistor MP1 and the NMOS transistor MN1 are coupled to the drains of the NMOS transistor MN1 and the PMOS transistor MP1, respectively. Both the source region S and the bulk of the PMOS transistor MP1 are coupled to the power supply VDD, and both the source region S and the bulk of the NMOS transistor MN1 are coupled to the ground VSS. The configurations of the PMOS transistor MP1 and the NMOS transistor MN1 make it so the gate voltage can turn on the channel-conduction of the transistors, and the channel resistance is series connected with the gate of the PMOS transistor MP1 and the NMOS transistor MN1. Therefore, the MOS capacitance with series channel-resistance is provided to increase the ESD protection and decrease the gate-leakage current for the power supply VDD and the ground VSS.

For the PMOS transistors MP2 and MP3 in the N-type well 110 and the NMOS transistor MN2 and MN3 in the P-type well 120, the configurations of the source region Sc and the drain region Dc can provide embedded P+ and N+ active collectors in the N-type well 110 and the P-type well 120, respectively. For the P+ active collector in the PMOS transistors MP2 and MP3, the source region Sc or the drain region Dc in the N-type well 110 is coupled to the ground VSS through the low resistance path (e.g. Path1 of FIG. 7B), and the low resistance path can be n-channel conduction in the NMOS transistor MN1. Similarly, For the N+ active collector in the NMOS transistors MN2 and MN3, the source region Sc or the drain region Dc in the P-type well 120 is coupled to the power supply VDD through the low resistance path (e.g. Path2 of FIG. 8B), and the low resistance path can be P-channel conduction in the PMOS transistor MP1. Therefore, the high-conductive paths are provided to discharge minority carriers in the base region of BJT Q1 and Q2 in the parasitic PNPN structure. Consequently, the active collectors form the shunting paths from the base regions of the BJT Q1/Q2 to the ground VSS and the power supply VDD. The shunting paths can improve the required base-emitter voltage of the BJT Q1/Q2 for turning on the SCR structure, thereby avoiding the undesired latch-up. Therefore, the intrinsic latch-up immunity of the capacitor cell is enhanced and the holding voltage and trigger current of the SCR are increased in the ICs.

Embodiments for capacitor cells and structures thereof are provided. The capacitor cell has a cross-coupled de-coupling structure formed by the PMOS transistor MP1 and the NMOS transistor MN1, and the cross-coupled de-coupling structure is capable of providing the MOS capacitance for reducing the power supply noise. Furthermore, the capacitor cells further have two types of source/drain configurations, e.g. S/D and Sc/Dc capable of providing greater robustness against ESD stress and Latch-up. The source/drain configuration S/D provides the channel-conduction resistance to connect with the MOS capacitance, which can improve the ESD level and reduce the gate-leakage. Furthermore, the source/drain configuration Sc/Dc provides embedded active collectors in the well-region of MOS transistors, which can improve the latch-up immunity of capacitor cells. Therefore, the capacitor cell can protect itself from the high current conduction (Latch-up) condition triggered by the noise sources in the power supply lines in an IC. Moreover, the capacitor cell can have lower layout area requirement for latch-up protection schemes such as strap density, spacing between PMOS and NMOS, and quard-rings placement. Consequently, chip area of the IC is decreased.

In some embodiments, a capacitor cell is provided. A first PMOS transistor is coupled between a power supply and a first node, having a gate coupled to a second node. A first NMOS transistor is coupled between a ground and the second node, having a gate coupled to the first node. A second PMOS transistor has a drain coupled to the second node, a gate coupled to the second node, and a source coupled to the power supply or the first node. A second NMOS transistor has a drain coupled to the first node, a gate coupled to the first node, and a source coupled to the ground or the second node.

In some embodiments, a capacitor cell structure is provided. A semiconductor substrate has a first conductive type. A first well region on the semiconductor substrate has a second conductive type. A first source region is in the first well region and coupled to a first power line. A first drain region is in the first well region. A first active region is between the first source region and the first drain region in the first well. A second well region on the semiconductor substrate has the first conductive type. A second source region is in the second well region and coupled to a second power line. A second drain region is in the second well region and coupled to the first active region. A second active region is between the second source region and the second drain region in the second well region, and the second active region is coupled to the first drain region. A first doped region is in the first well region and coupled to the second drain region, and has the first conductive type. A third active region is between the first doped region and the first drain region or between the first doped region and the first source region in the first well region, and is coupled to the second drain region. A second doped region is in the second well region and coupled to the first drain region, and has the second conductive type. A fourth active region is between the second doped region and the second drain region or between the second doped region and the second source region in the second well region, and is coupled to the first drain region.

In some embodiments, a capacitor cell structure is provided. The capacitor cell structure includes a semiconductor substrate, an N-type well region on the semiconductor substrate, a plurality of PMOS transistors, a P-type well region on the semiconductor substrate, and a plurality of NMOS transistors. Each of the PMOS transistors includes a first source region, a first drain region, and a first active region between the first source region and the first drain region in the N-type well region, and the first source regions and the first drain regions are interlaced to form a first row. Each of the NMOS transistors includes a second source region, a second drain region, and a second active region between the second source region and the second drain region in the P-type well region, and the second source regions and the second drain regions are interlaced to form a second row. The first source regions of a first group of PMOS transistors are coupled to a power line, and the second source regions of a first group of NMOS transistors are coupled to a ground. The first active regions of the PMOS transistors are coupled to the second drain regions of the first group of NMOS transistors, and the second active regions of the NMOS transistors are coupled to the first drain regions of the first group of PMOS transistors. The first drain regions of a second group of the PMOS transistors are coupled to the second active regions or the second drain regions of the first group of the NMOS transistors, and the first source regions of the second group of the PMOS transistors are coupled to the second drain regions of the first group of the NMOS transistors or the power line. The second drain regions of a second group of the NMOS transistors are coupled to the first active regions or the first drain regions of the first group of the PMOS transistors, and the second source regions of the second group of the NMOS transistors are coupled to the first drain regions of the first group of PMOS transistors or the ground.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor cell, comprising:
    a first PMOS transistor, having a source directly connected to a power supply, a drain directly connected to a first node, and a gate directly connected to a second node;
    a first NMOS transistor, having a source directly connected to a ground, a drain directly connected to the second node, and a gate directly connected to the first node;
    a second PMOS transistor, having a drain directly connected to the second node, a gate directly connected to the second node, and a source directly connected to the power supply or the first node; and
    a second NMOS transistor, having a drain directly connected to the first node, a gate directly connected to the first node, and a source directly connected to the ground or the second node.

2. The capacitor cell as claimed in claim 1, wherein the source of the second PMOS transistor is directly connected to the power supply, and the source of the second NMOS transistor is directly connected to the ground.

3. The capacitor cell as claimed in claim 1, wherein the source of the second PMOS transistor is directly connected to the power supply, and the source of the second NMOS transistor is directly connected to the second node.

4. The capacitor cell as claimed in claim 1, wherein the source of the second PMOS transistor is directly connected to the first node, and the source of the second NMOS transistor is directly connected to the ground.

5. The capacitor cell as claimed in claim 1, wherein the source of the second PMOS transistor is directly connected to the first node, and the source of the second NMOS transistor is directly connected to the second node.

6. A capacitor cell structure, comprising:
    a semiconductor substrate, having a first conductive type;
    a first well region on the semiconductor substrate, having a second conductive type;
    a first source region in the first well region and coupled to a first power line;
    a first drain region in the first well region;
    a first active region between the first source region and the first drain region in the first well region;
    a second well region on the semiconductor substrate, having the first conductive type;
    a second source region in the second well region and coupled to a second power line;
    a second drain region in the second well region and coupled to the first active region;
    a second active region between the second source region and the second drain region in the second well region and coupled to the first drain region;
    a first doped region in the first well region and coupled to the second drain region, having the first conductive type;
    a third active region between the first doped region and the first drain region or between the first doped region and the first source region in the first well region and coupled to the second drain region;
    a second doped region in the second well region and coupled to the first drain region, having the second conductive type; and
    a fourth active region between the second doped region and the second drain region or between the second doped region and the second source region in the second well region and coupled to the first drain region.

7. The capacitor cell structure as claimed in claim 6, further comprising:
    a third doped region in the first well region and coupled to the first power line, having the second conductive type; and
    a fourth doped region in the second well region and coupled to the second power line, having the first conductive type.

8. The capacitor cell structure as claimed in claim 7, further comprising:
    a first isolation region between the third doped region and the first source region in the first well region;
    a second isolation region between the fourth doped region and the second source region in the first well region; and
    a third isolation region between the first well region and the second well region.

9. The capacitor cell structure as claimed in claim 6, wherein the first doped region is a third source region, and the third active region is between the third source region and the first drain region, wherein the second doped region is a fourth source region, and the fourth active region is between the fourth source region and the second drain region.

10. The capacitor cell structure as claimed in claim 6, wherein the first doped region is a third drain region, and the third active region is between the third drain region and the first source region, wherein the second doped region is a fourth drain region, and the fourth active region is between the fourth drain region and the second source region.

11. The capacitor cell structure as claimed in claim 6, wherein the first doped region is a third source region, and the third active region is between the third source region and the first drain region, wherein the second doped region is a third drain region, and the fourth active region is between the third drain region and the second source region.

12. The capacitor cell structure as claimed in claim 6, wherein the first doped region is a third drain region, and the third active region is between the third drain region and the first source region, wherein the second doped region is a third source region, and the fourth active region is between the third source region and the second drain region.

13. The capacitor cell structure as claimed in claim 6, wherein one of the first and second power lines is coupled to a power supply, and the other power line is coupled to a ground.

14. A capacitor cell structure, comprising:
a semiconductor substrate;
an N-type well region on the semiconductor substrate;
a plurality of PMOS transistors, each of the PMOS transistors comprises a first source region, a first drain region, and a first active region between the first source region and the first drain region in the N-type well region, wherein the first source regions and the first drain regions are interlaced to form a first row;
a P-type well region on the semiconductor substrate; and
a plurality of NMOS transistors, each of the NMOS transistors comprises a second source region, a second drain region, and a second active region between the second source region and the second drain region in the P-type well region, wherein the second source regions and the second drain regions are interlaced to form a second row,
wherein the first source regions of a first group of the PMOS transistors are coupled to a power line, and the second source regions of a first group of the NMOS transistors are coupled to a ground,
wherein the first active regions of the PMOS transistors are coupled to the second drain regions of the first group of the NMOS transistors, and the second active regions of the NMOS transistors are coupled to the first drain regions of the first group of the PMOS transistors,
wherein the first drain regions of a second group of the PMOS transistors are coupled to the second active regions or the second drain regions of the first group of the NMOS transistors, and the first source regions of the second group of the PMOS transistors are coupled to the second drain regions of the first group of the NMOS transistors or the power line,
wherein the second drain regions of a second group of the NMOS transistors are coupled to the first active regions or the first drain regions of the first group of the PMOS transistors, and the second source regions of the second group of the NMOS transistors are coupled to the first drain regions of the first group of PMOS transistors or the ground.

15. The capacitor cell structure as claimed in claim 14, wherein bulks of the PMOS transistors are coupled to the power line, and bulks of the NMOS transistors are coupled to the ground.

16. The capacitor cell structure as claimed in claim 14, wherein when the first drain regions of the second group of the PMOS transistors are coupled to the second active regions of the first group of the NMOS transistors, the first source regions of the second group of the PMOS transistors are coupled to the second drain regions of the first group of the NMOS transistors.

17. The capacitor cell structure as claimed in claim 14, wherein when the first drain regions of the second group of the PMOS transistors are coupled to the second drain regions of the first group of the NMOS transistors, and the first source regions of the second group of the PMOS transistors are coupled to the power line.

18. The capacitor cell structure as claimed in claim 14, wherein when the second drain regions of the second group of the NMOS transistors are coupled to the first active regions of the first group of the PMOS transistors, and the second source regions of the second group of the NMOS transistors are coupled to the first drain regions of the first group of PMOS transistors.

19. The capacitor cell structure as claimed in claim 14, wherein when the second drain regions of a second group of the NMOS transistors are coupled to the first drain regions of the first group of the PMOS transistors, and the second source regions of the second group of the NMOS transistors are coupled to the ground.

20. The capacitor cell structure as claimed in claim 14, wherein the number of the PMOS transistors is identical to the number of the NMOS transistors.

* * * * *